United States Patent [19]
Meikle et al.

[11] Patent Number: 5,449,314
[45] Date of Patent: Sep. 12, 1995

[54] METHOD OF CHEMICAL MECHANICAL POLISHING FOR DIELECTRIC LAYERS

[75] Inventors: Scott Meikle; Valerie Ward, both of Boise, Id.

[73] Assignee: Micron Technology, Inc., Boise, Id.

[21] Appl. No.: 232,610

[22] Filed: Apr. 25, 1994

[51] Int. Cl.$^6$ .................. B24B 7/22; H01L 21/00
[52] U.S. Cl. .................. 451/41; 451/31; 437/225; 437/974
[58] Field of Search .................. 451/29, 30, 31, 41; 437/225, 974

[56] References Cited

U.S. PATENT DOCUMENTS

| | | | |
|---|---|---|---|
| 3,841,031 | 10/1994 | Walsh | 51/283 |
| 4,680,893 | 7/1987 | Cronkhite et al. | 51/5 R |
| 5,036,015 | 7/1991 | Sandhu et al. | 437/8 |
| 5,137,597 | 8/1992 | Curry II et al. | 156/636 |
| 5,142,828 | 9/1992 | Curry, II | 51/281 R |
| 5,169,491 | 12/1992 | Doan | 156/636 |
| 5,230,184 | 7/1993 | Bukhman | 51/283 R |
| 5,312,512 | 5/1994 | Allman et al. | 156/636 |
| 5,314,843 | 5/1994 | Yu et al. | 437/225 |
| 5,332,467 | 7/1994 | Sone et al. | 156/636 |
| 5,356,513 | 10/1994 | Burke et al. | 156/636 |

OTHER PUBLICATIONS

Patrick et al., "Application of Chemical Mechanical Polishing to the Fabrication of VLSI Circuit Interconnections," *J. Electrochem Soc.* vol. 138 No. 6, pp. 1778–1784, Jun. 1991.

Heyboer et al., "Chemomechanical Silicon Polish," *J. Electochem. Soc.*, vol. 138 No. 3, pp. 774–777, Mar. 1991.

Surfacetech Review, Rodel Products Corp., Dec. 1986, vol. 1, Issue 1.

Yu et al., "Submicron Aluminum Plug Process Utilizing High Temperature Sputtering and Chemical Mechanical Polishing," Conference Proceedings ULSI-VII, Materials Research Society, pp. 519–524, 1992.

Wolf, "Silicon Processing For The VLSI ERA", vol. 2-Process Integration, Lattice Press, pp. 198–239.

*Primary Examiner*—Robert A. Rose
*Attorney, Agent, or Firm*—Stephen A. Gratton

[57] ABSTRACT

A method of forming a planarized dielectric layer includes depositing a dielectric material on a substrate with a dopant concentration that decreases with depth and then chemically mechanically polishing the doped dielectric material. During the chemical mechanical polishing process the polish rate will be relatively fast initially but will slow down as the lighter doped material is contacted. Global planarity and polish selectivity are improved because the dopant gradient will automatically slow down the polish rate in areas where the lighter doped material is contacted. The high points of the dielectric material will thus polish faster than the low points. In an alternate embodiment of the invention, an underlying layer is deposited below a dopant graded dielectric layer having a predetermined dopant concentration that decreases with depth. The underlying layer may be undoped or uniformly doped. During the chemical mechanical planarization process, the dielectric layer with the graded profile is substantially removed. This insures that subsequent process steps will not be affected by a planarized dielectric layer having a non-uniform dopant concentration.

18 Claims, 3 Drawing Sheets

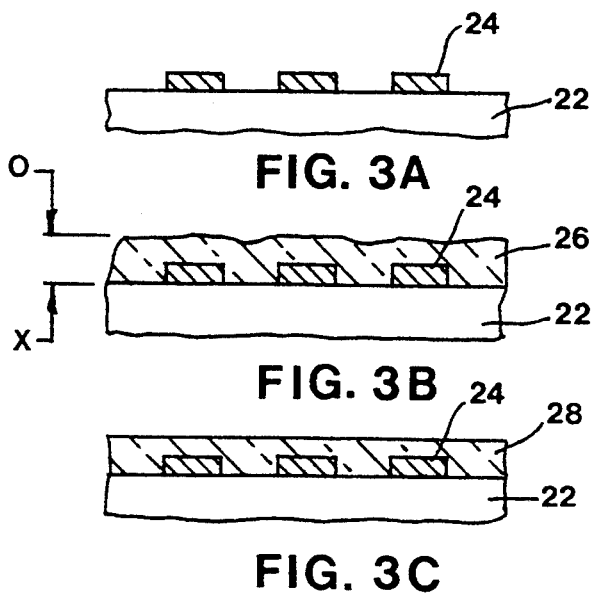
FIG. 3A
FIG. 3B
FIG. 3C
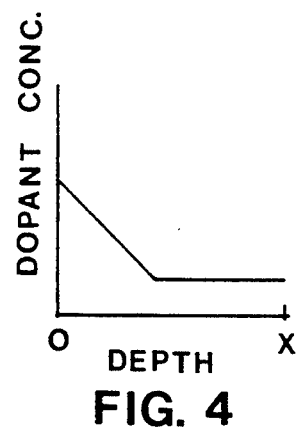
FIG. 4
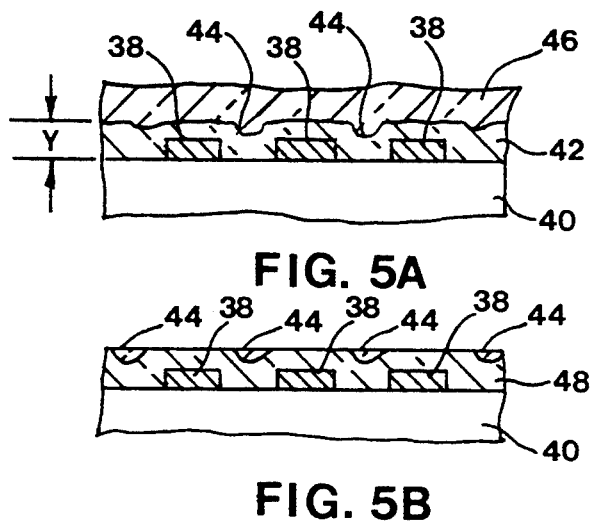
FIG. 5A
FIG. 5B
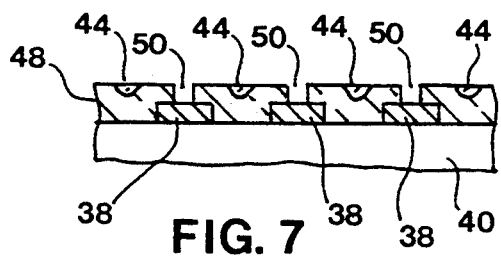
FIG. 7

METHOD OF CHEMICAL MECHANICAL POLISHING FOR DIELECTRIC LAYERS

Field of the Invention

This invention relates to semiconductor manufacture and more particularly to an improved method of chemical mechanical polishing and for forming planarized dielectric layers.

BACKGROUND OF THE INVENTION

One technique that is used in semiconductor manufacture for planarizing dielectric layers is chemical mechanical polishing (planarizing) or (CMP). Chemical mechanical polishing involves holding and rotating a semiconductor wafer against a wetted polishing platen under controlled chemical, pressure and temperature conditions. Typically an aqueous colloidal silica solution is used as the abrasive fluid. The polishing mechanism is a combination of mechanical action and the chemical reaction of the material being polished with the aqueous solution.

As circuit densities increase, chemical mechanical polishing has become one of the most viable techniques for planarization particularly for interlevel dielectric layers. In view of this, improved methods of chemical mechanical polishing are being increasingly sought. One aspect of chemical mechanical polishing in need of improvement is the speed and throughput of the process for semiconductor manufacture. In general, CMP is a relatively slow and time consuming process. During the polishing process semiconductor wafers must be individually loaded into a carrier, polished and then unloaded from the carrier. The polishing step in particular is very time consuming and may require several minutes.

Recently, different techniques have been used in the art for increasing the speed and throughput of the CMP process. As an example, more aggressive aqueous solutions have been developed to increase the speed of the polishing step. Higher carrier downforces and higher rpms for the polishing platen are also sometimes used. Although these techniques are somewhat successful, they may adversely effect the polishing process and the uniformity of the polished surface.

Endpoint detection, for instance, is more difficult to control when aggressive solutions and higher carrier downforces are employed. In addition, the polishing process may not proceed uniformly across the surface of the wafer. The hardness or composition of a dielectric layer (or polishing platen) may vary in certain areas. This in turn may cause a dielectric layer to polish faster or slower in some areas effecting its global planarity. This problem may be compounded by aggressive solutions, higher carrier downforces and increased rpms.

In view of these and other problems of prior art CMP processes, there is a need in the art for improved methods of CMP. In addition, there is a need in the art for improved methods of forming and planarizing dielectric layers. Accordingly, it is an object of the present invention to provide an improved method of CMP and an improved method of forming and planarizing dielectric layers using CMP. It is a further object of the present invention to provide an improved method of CMP that is suitable for large scale semiconductor manufacture and in which increased process speeds and throughput are obtained without sacrificing global planarity. It is a further object of the present invention to provide an improved method of forming and planarizing dielectric layers in which the dielectric layer can be formed with a uniform composition and global planarity using CMP.

These and other objects, advantages and capabilities of the present invention will become more apparent as the description proceeds.

SUMMARY OF THE INVENTION

In accordance with the present invention an improved method of chemical mechanical polishing for forming and planarizing dielectric layers is provided. The method generally stated, comprises doping a dielectric layer with a dopant having a predetermined concentration profile. The dopant concentration is highest near the surface of the dielectric layer and decreases with the depth into the dielectric layer. In general, a highly doped material will polish faster than a lighter doped material. By setting the dopant concentration highest at the surface of the dielectric layer the outlying material will polish more easily and the initial polish rate will be relatively fast. As the polishing process continues the polish rate will fall as the lighter doped material is contacted. The overall polish time is reduced, however, because of the faster initial polish rate. Global uniformity is improved because the dopant gradient automatically slows down the polish rate in areas where the lighter doped material has been reached. This allows the polishing process to catch up in some areas and slow down in others and helps to provide a global uniformity to the planarized surface. In other words, the high points are polished faster than low points and the selectivity of the polishing process is improved.

Suitable dopants include boron, phosphorus, arsenic and germanium. The dopant is deposited in a precise concentration profile using techniques that are known in the art such as the simultaneous chemical vapor deposition of a deposition species with a dopant species. Boron is a preferred dopant because it allows increased planarity in a polished dielectric layer and does not easily form corrosive byproducts.

In an alternate embodiment of the invention for achieving an undoped or uniformly doped dielectric layer, the dielectric layer may be initially deposited in two portions. A lower portion of the dielectric layer, closest to the substrate, may be undoped or formed with a uniform dopant concentration. An upper portion of the dielectric layer, closest to the surface to be planarized, may be formed with a graded dopant profile as previously described. During CMP most of the upper portion of the dielectric layer will be removed leaving a planarized dielectric layer that is undoped or has a substantially uniform dopant concentration. This insures that subsequent process steps, such as via formation, will not be affected by a non-uniform dopant concentration.

BRIEF DESCRIPTION OF THE DRAWINGS

FIGS. 3A–3C are schematic cross sectional views of a semiconductor structure illustrating the method of the invention as outlined in FIG. 1;

FIG. 4.4s a graph plotting dopant concentration vs. depth for the dielectric layer shown in FIG. 3A;

FIGS. 5A–5B are schematic cross sectional views of a semiconductor structure illustrating the alternate embodiment of the invention as outlined in FIG. 2;

FIG. 7 is a schematic cross sectional view of a semiconductor structure having a dielectric layer planarized in accordance with the invention and showing the formation of vias through the planarized dielectric layer.

DETAILED DESCRIPTION OF THE INVENTION

As used herein the term "concentration profile" refers to the distribution of a dopant in a dielectric layer as a function of depth. The term "polish rate" refers to the rate of material removal during chemical mechanical polishing of a dielectric layer. The term "polish selectivity" refers to the ratio of the rate of polishing high points versus the rate of polishing low points on a dielectric layer. In general, a high "polish selectivity" wherein high points are removed faster than the low points is a desirable situation.

The chemical mechanical polishing processes mentioned in this application can be carried out using apparatus that are known in the art. One suitable apparatus is manufactured by Westech Engineering and is designated as a Model 372 Polisher. Other suitable apparatus are described in U.S. Pat. Nos. 5,036,015; 3,841,031; and 5,142,828 which are incorporated herein by reference.

Figure 1:
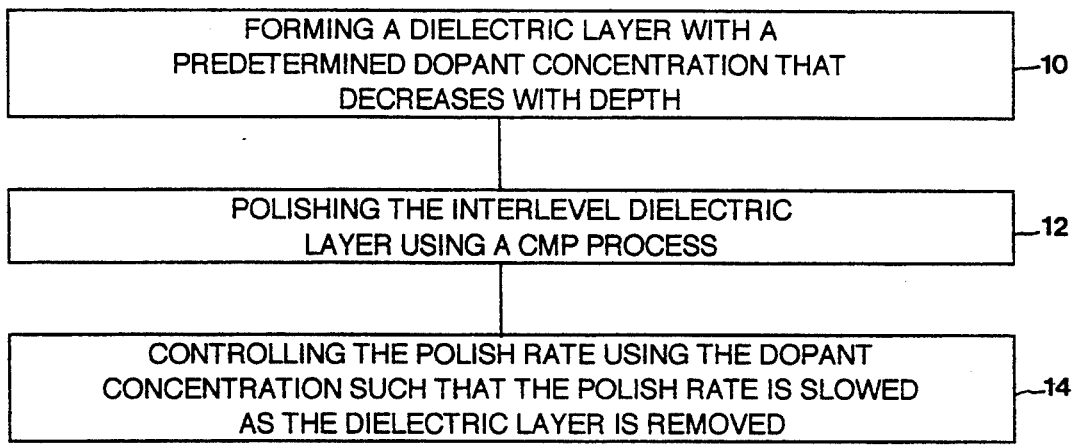
FIG. 1 is a flow diagram outlining the steps involved in the chemical mechanical polishing of a dielectric layer in accordance with the invention.

With reference to FIG. 1, the method of the invention broadly stated, includes the steps of:

forming a dielectric layer with a predetermined dopant concentration that decreases with depth, step 10;

polishing the dielectric layer using a CMP process, step 12; and controlling the polish rate using the dopant concentration such that the polish rate is slowed as the dielectric layer is removed, step 14.

This process is illustrated schematically in FIGS. 3A–3C. FIG. 3A shows a substrate oxide 22 on which parallel spaced conducting lines 24 have been formed. As an example, the substrate oxide 22 may be silicon dioxide ($SiO_2$) formed on a silicon substrate (not shown). The conducting lines 24 may be aluminum or another conductive material.

In FIG. 3B, a dielectric layer 26 has been deposited over the conducting lines 24 and on the substrate 22. The dielectric layer 26 may be silicon dioxide or another dielectric material such as fluorine containing silicon dioxide. In order to facilitate subsequent processing the dielectric layer 26 requires planarization.

In accordance with the method of the invention the dielectric layer 26 is doped with a predetermined concentration profile to control the polish rate during the CMP process. Suitable dopants include boron, phosphorus, arsenic and germanium. The concentration profile of the dopant is controlled such that the concentration of the dopant is highest near the surface and lowest near the interface of the dielectric layer 26 and the substrate oxide 22. In other words the concentration of the dopant decreases as the depth increases.

This is shown graphically in FIG. 4. At a depth of zero, at the surface of the dielectric layer 26, the dopant concentration of the dielectric layer 26 is high. The dopant concentration then drops in a substantially linear manner and then levels off at a relatively low level. At a depth of x, at the interface of the dielectric layer 26 and the substrate oxide 22, the dopant concentration is relatively low. Representative ranges of dopant concentration are from 2% to 5% near the surface of the dielectric layer 26 and from 0% to 2% near the interface of the dielectric layer 26 with the substrate oxide 22.

In general, a dielectric material having a relatively high concentration of a dopant will have a higher polish rate during CMP than the same material having a relatively low concentration of the dopant. The polish rate of the dielectric layer 26 thus decreases with depth. Stated differently, the polish rate will be relatively high near the original surface but will slow down as more material is removed. In a similar manner the high points of the dielectric layer 26 will polish faster than the low points because the high points have a higher dopant concentration. Polish selectivity will thus be high. This concentration profile for the dopant is selected to achieve a desired polish rate at each depth.

A predetermined concentration profile of dopant atoms may be obtained using deposition and diffusion procedures that are known in the art. As an example, a chemical vapor deposition process may be used to simultaneously deposit a dopant species and a deposition species and form a doped layer of material. For example, a capacitively coupled RF plasma deposition system using source gases for the deposition species such as $SiH_4$, $O_2$, $N_2O$, TEOS, or $O_3$ can be used to deposit a layer of $SiO_2$. The $SiO_2$ can be doped during deposition using source gases for the dopant species such as $B_2H_6$ or $PH_3$. The $SiO_2$ layer would typically be deposited at 300°–400° C. at pressures ranging from 1.0 to 500 Torr. During the deposition process the relative concentrations of the source gases for the deposition species and dopant species may be controlled to achieve a predetermined concentration profile for the dopant.

Figure 2:
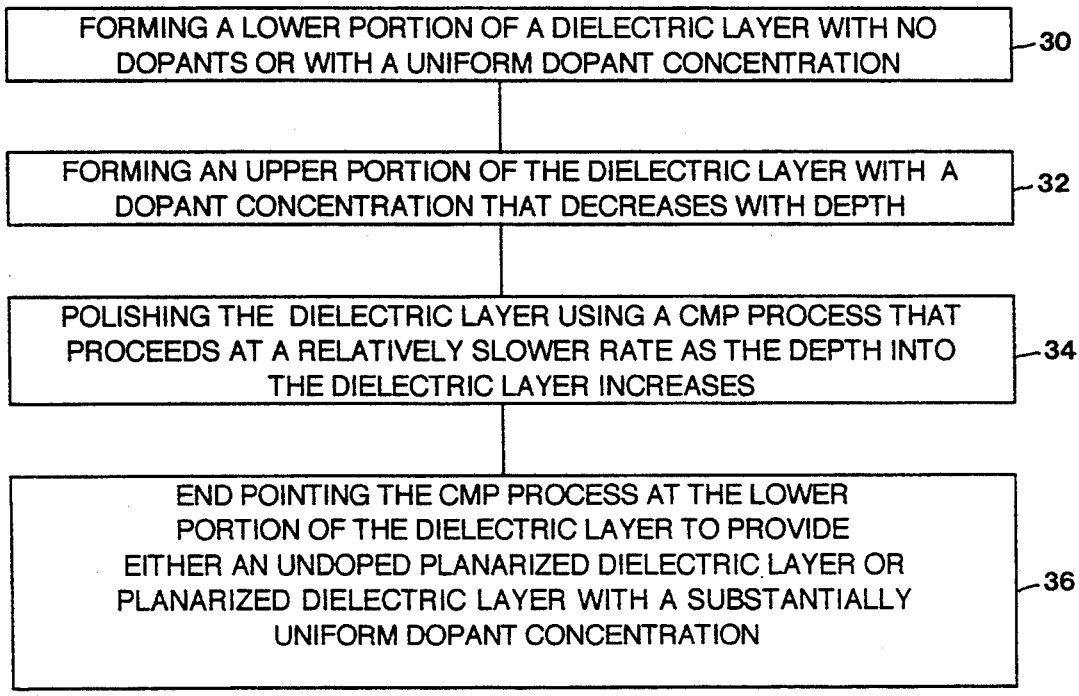
FIG. 2 is a flow diagram outlining the steps involved in the chemical mechanical polishing of a dielectric layer in accordance with an alternate embodiment of the invention for providing an undoped or uniformly doped planarized dielectric layer.

For providing a planarized dielectric layer with no dopants, or with a uniform dopant concentration, an alternate embodiment of the invention is outlined in FIG. 2. The alternate embodiment includes the steps of:

forming a lower portion of a dielectric layer with no dopants or with a uniform dopant concentration, step 30;

forming an upper portion of the dielectric layer with a dopant concentration that decreases with depth, step 32;

polishing the dielectric layer using a CMP process that proceeds at a relatively slower rate as the depth into the dielectric layer increases, step 34; and end pointing the CMP process within the lower portion of the dielectric layer to provide either an undoped planarized dielectric layer or planarized dielectric layer with a substantially uniform dopant concentration, step 36.

With reference to FIG. 5A, a substrate oxide 40 includes an array of parallel spaced conducting lines 38. In accordance with the invention, a lower dielectric layer 42 is deposited over the conducting lines 38 and on the substrate oxide 40. The lower dielectric layer 42 is undoped or may be doped with a dopant at a uniform concentration. The lower dielectric layer 42 includes indentations 44 that form during the deposition process and correspond to the spaces between the conducting lines 38. The indentations 44 form as a result of the lower dielectric layer 42 conforming to the topography of the conducting lines 38.

Following deposition of the lower dielectric layer 42, an upper dielectric layer 46 is deposited on the lower dielectric layer 42. The upper dielectric layer 46 is doped with a dopant having a concentration that decreases with depth. The upper dielectric layer 46 is thus similar to the dielectric layer 26 previously described (FIG. 3B).

Next as shown in FIG. 5B, a CMP process is performed to form a planarized dielectric layer 48. During the CMP process, the upper dielectric layer 46 is polished substantially as previously described for dielectric layer 26. Initially the polish rate through the upper dielectric layer 46 will be relatively fast because the high dopant concentration near the surface forms a layer of material that is relatively easy to polish. As the polishing process continues, however, and more material is removed, the polish rate slows down as the lighter doped material is contacted. At the same time, the high points will polish faster than the low points and polish selectivity will be high The polishing process, as well as the initial thickness "y" of the lower dielectric layer 42 (FIG. 5A), can be controlled such that the planar endpoint of the planarized dielectric layer 48 falls within the lower dielectric layer 42. The planarized dielectric layer 48 therefore, with the exception of the indentations 44, is entirely formed of the lower dielectric layer 42. The planarized dielectric layer 48 will therefore be undoped or have a substantially uniform dopant concentration depending on how the lower dielectric layer 42 was formed. This insures that subsequent process steps, such as via formation, are not effected by a non uniform dopant concentration.

Although either boron, phosphorus, arsenic, or germanium can be used as a dopant in the method of the invention, boron is preferred. In general, the topography and polish selectivity of a boron doped dielectric during CMP is more favorable than that of a phosphorus or arsenic doped dielectric. The wafer will therefore planarize globally at a substantially uniform rate with boron as a dopant.

EXAMPLE 1

In order to compare the polish rates of dielectric oxides with different dopants and dopant concentrations, plasma deposited silicon dioxide ($SiO_2$) samples were CMPed under similar conditions. The $SiO_2$ deposition conditions were as follows:

Pressure=5–10 Torr
$SiH_4$/TEOS flow rate ratio=1:1
Power=300–500 W
$B_2H_6$ flow rate=20–50 sccm
$PH_3$ flow rate=20–50 sccm The CMP process condition were as follows:
Pressure=5–7 psi
Pad/wafer velocity=100 cm/s
Colloidal silica slurry The following data was obtained.

TABLE 1

|  | Undoped | 1% Phos. | 3% Phos. | 3% Boron |
|---|---|---|---|---|
| Polish Rate (Å/sec) | 51.0 | 61.4 | 84.8 | 70.4 |

As can be seen, the polish rate with a doped oxide is higher than with an undoped oxide. In addition the polish rate increases with the concentration of a dopant.

Experiment 2

In this experiment the polishing selectivity as a function of polish time was determined for an undoped control sample and compared to a 3% boron doped sample and to a 3% phosphorus doped sample. Polish selectivity was measured by comparing the polish rate in high areas (i.e., the array) to the polish rate in the low areas (i.e., the scribe). The array consisted of aluminum interconnects. Table 2 summarizes the dielectric deposition conditions.

TABLE 2

| Array | Composition |
|---|---|
| Control | 20K Å of undoped silicon dioxide |
| Phosphorus | 14K Å of undoped silicon dioxide + 6K Å of 3% phosphorus doped |
| Boron | 14K Å of undoped silicon dioxide + 6K Å of 3% boron doped |

Figure 6:
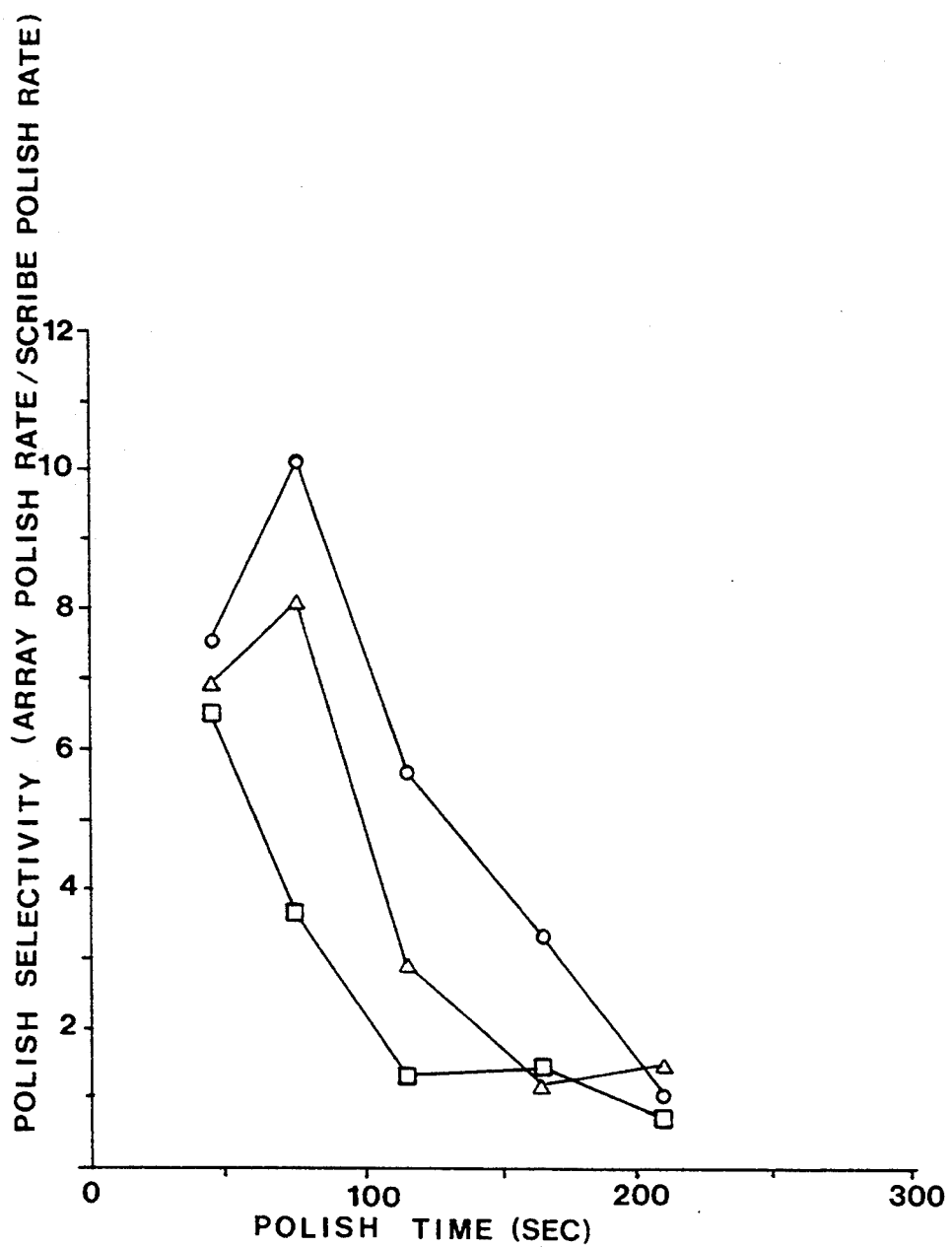
FIG. 6 is a graph plotting polish selectivity vs. polish time for a control sample and for samples formed with boron and phosphorus doped dielectric layers.

The results of this experiment are summarized in FIG. 6. The curve plotted with circular points is the control sample, the curve plotted with triangular points is the 3% phosphorus doped sample, and the curve plotted with square points is the 3% boron doped sample.

The sample array with 3% boron doped oxide has a polish selectivity similar to that of the control array. This helps to provide a globally planarized surface. From this data it was concluded that boron doping allows high polish rates without a loss in polish selectivity. The 3% phosphorus doped oxide sample, on the other hand, has a significantly reduced polish selectivity indicating global planarization characteristics that are not as favorable as boron.

Experiment 3

In this experiment a sample was formed in accordance with the alternate embodiment of the invention outlined in FIG. 2 and shown in FIGS. 5A–5B. The purpose of the experiment was to demonstrate the planarization of an undoped dielectric layer suitable for the formation of vias. The upper dielectric layer (46 FIG. 5A) was formed of phosphorus doped silicon dioxide having a dopant concentration that decreased with depth. The lower dielectric layer (42 FIG. 5A) was formed of undoped silicon dioxide. This stack was deposited on metal conducting lines (38 FIG. 5B) and then CMPed in accordance with the method of the invention.

Next, as illustrated in FIG. 7, vias 50 were etched through the planarized dielectric layer 48 and to the conducting lines 38. Photomicrographs of the resultant structure illustrated that the planarized dielectric layer 48 in the area of the vias 50 was undoped. It was concluded that this method insures that via formation was not affected by a non-uniform dopant concentration.

Thus the invention provides an improved method of CMP and an improved method for planarizing interlevel dielectric layers. While the method of the invention has been described with reference to certain preferred embodiments, as will be apparent to those skilled in the art, certain changes and modifications can be made without departing from the scope of the invention as defined by the following claims.

What is claimed is:

1. In semiconductor manufacture, a method of chemical mechanical polishing for forming a planarized dielectric layer comprising:

depositing a doped dielectric material on a substrate;

controlling a dopant concentration of the dielectric material to produce a predetermined dopant concentration profile in the dielectric material with the dopant concentration decreasing with increasing depth into the dielectric material and then leveling to a substantially uniform concentration;

polishing the dielectric material using a chemical mechanical polishing process; and controlling a polish rate during the chemical mechanical polishing process using the predetermined dopant concentration such that the polish rate is slowed with increasing depth into the dielectric material.

2. The method as recited in claim 1 and further comprising:

depositing the dielectric material on an undoped dielectric layer formed on the substrate; and endpointing the chemical mechanical polishing process within the undoped dielectric layer to form the planarized dielectric layer substantially of the undoped dielectric layer.

3. The method as recited in claim 1 and further comprising:

depositing the dielectric material on a uniformly doped dielectric layer formed on the substrate; and endpointing the chemical mechanical polishing process within the uniformly doped dielectric layer to form the planarized dielectric layer substantially of the uniformly doped dielectric layer.

4. The method as recited in claim 1 and wherein a dopant for the dielectric material is selected from the class consisting of boron, phosphorus, arsenic and germanium.

5. The method as recited in claim 1 and wherein the predetermined dopant concentration is about 2-5% at an outer surface of the dielectric layer and greater than zero to about 2% at an interface of the dielectric material with the substrate.

6. The method as recited in claim 1 and wherein the predetermined dopant concentration is selected such that high points of the dielectric material polish at a faster rate than low points.

7. The method as recited in claim 1 and wherein the dielectric material is silicon dioxide.

8. In semiconductor manufacture, a chemical mechanical polishing method for forming a planarized dielectric layer on a substrate comprising:

depositing an undoped dielectric layer on the substrate;

depositing a doped dielectric layer on the undoped dielectric layer;

controlling a dopant concentration of the doped dielectric layer to produce a predetermined dopant concentration profile with the dopant concentration decreasing with increasing depth into the doped dielectric layer and then leveling to a substantially uniform concentration;

polishing the doped dielectric layer using a chemical mechanical polishing process;

controlling a polish rate of the chemical mechanical polishing process using the predetermined dopant concentration such that the polish rate decreases with increasing depth into the doped dielectric layer; and end pointing the polishing process at a planar endpoint to form the planarized dielectric layer substantially of the undoped dielectric layer.

9. The method as recited in claim 8 and wherein a dopant for the doped dielectric layer is selected from the class consisting of boron, phosphorus, arsenic and germanium.

10. The method as recited in claim 8 and wherein high points of the doped dielectric layer polish at a faster rate than low points.

11. The method as recited in claim 8 and wherein the undoped dielectric layer and the doped dielectric layer are formed of silicon dioxide.

12. The method as recited in claim 8 and wherein the undoped dielectric layer is deposited over metal conducting lines.

13. The method as recited in claim 12 and further comprising forming vias through the planarized dielectric layer to the metal conducting lines.

14. In semiconductor manufacture, a chemical mechanical polishing method for forming a planarized dielectric layer on a substrate comprising:

depositing a uniformly doped dielectric layer on the substrate;

depositing a doped dielectric layer on the uniformly doped dielectric layer;

controlling a dopant concentration of the doped dielectric layer to produce a predetermined dopant concentration profile with the dopant concentration decreasing with increasing depth into the doped dielectric layer and then leveling to a substantially uniform concentration;

polishing the doped dielectric layer using a chemical mechanical polishing process;

controlling a polish rate of the chemical mechanical polishing process using the predetermined dopant concentration such that the polish rate decreases with increasing depth into the doped dielectric layer and high points of the doped dielectric layer polish faster than low points; and end pointing the polishing process at a planar endpoint to form the planarized dielectric layer substantially of the uniformly doped dielectric layer.

15. The method as recited in claim 14 and wherein a dopant for the doped dielectric layer is selected from the class consisting of boron, phosphorus, arsenic and germanium.

16. The method as recited in claim 14 and wherein a dopant for the uniformly doped dielectric layer is selected from the class consisting of boron, phosphorus, arsenic and germanium.

17. The method as recited in claim 14 and wherein the substrate is an oxide with spaced conducting lines thereon and the uniformly doped dielectric layer is deposited over the substrate and conducting lines.

18. The method as recited in claim 17 and wherein vias are etched through the planarized dielectric layer to the conducting lines.

* * * * *

UNITED STATES PATENT AND TRADEMARK OFFICE
CERTIFICATE OF CORRECTION

PATENT NO. : 5,449,314
DATED : September 12, 1995
INVENTOR(S) : Scott Meikle; Valerie Ward It is certified that error appears in the above-indentified patent and that said Letters Patent is hereby corrected as shown below:

Title page ,item [54]

In the title change "CHIMICAL" to --CHEMICAL--.

In column 1, line 2 change "CHIMICAL" to --CHEMICAL--.

Signed and Sealed this

Twenty-seventh Day of February, 1996

*Attest:*

BRUCE LEHMAN

*Attesting Officer*    *Commissioner of Patents and Trademarks*